United States Patent
Huang et al.

(10) Patent No.: US 10,636,797 B2
(45) Date of Patent: Apr. 28, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wen-Fu Huang, Kaohsiung (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/952,182

(22) Filed: Apr. 12, 2018

(65) Prior Publication Data

US 2019/0319030 A1  Oct. 17, 2019

(51) Int. Cl.
*H01L 27/108* (2006.01)
*H01L 21/02* (2006.01)
*H01L 21/311* (2006.01)

(52) U.S. Cl.
CPC .... *H01L 27/10894* (2013.01); *H01L 21/0217* (2013.01); *H01L 21/0223* (2013.01); *H01L 21/02126* (2013.01); *H01L 21/02164* (2013.01); *H01L 21/02167* (2013.01); *H01L 21/31111* (2013.01); *H01L 27/10805* (2013.01); *H01L 27/10897* (2013.01)

(58) Field of Classification Search
CPC ......... H01L 27/10894; H01L 27/10805; H01L 27/10897; H01L 21/02126; H01L 21/02164; H01L 21/02167; H01L 21/0217; H01L 21/0223; H01L 21/31111
See application file for complete search history.

(56) References Cited

U.S. PATENT DOCUMENTS

| | | | |
|---|---|---|---|
| 6,815,283 B2* | 11/2004 | Lee | H01L 27/105 257/E21.684 |
| 7,157,366 B2 | 1/2007 | Kim et al. | |
| 8,120,123 B2* | 2/2012 | Yoshida | H01L 21/82345 257/401 |
| 8,253,199 B2* | 8/2012 | Ando | H01L 21/76229 257/341 |
| 9,362,382 B1 | 6/2016 | Hung et al. | |
| 2003/0151069 A1* | 8/2003 | Sugimae | H01L 27/105 257/200 |
| 2013/0146966 A1* | 6/2013 | Ho | H01L 29/4236 257/330 |
| 2013/0248949 A1* | 9/2013 | Kirkpatrick | H01L 21/823864 257/288 |

(Continued)

*Primary Examiner* — Mark W Tornow
(74) *Attorney, Agent, or Firm* — Winston Hsu

(57) ABSTRACT

A method for fabricating semiconductor device includes the steps of: providing a substrate having a memory region and a logic region; forming a stack structure on the memory region and a gate structure on the logic region; forming a first cap layer on the stack structure and the gate structure; performing an oxidation process to form an oxide layer on the first cap layer; forming a second cap layer on the oxide layer; and removing part of the second cap layer, part of the oxide layer, and part of the first cap layer on the logic region to form a spacer adjacent to the gate structure.

9 Claims, 5 Drawing Sheets

(56) References Cited

U.S. PATENT DOCUMENTS

2014/0369115 A1* 12/2014 Kim .................. H01L 29/78
  365/182
2016/0020110 A1* 1/2016 Lu .................. H01L 29/7848
  257/618

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of using oxidation process to form oxide layer on a cap layer on memory region.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a substrate having a memory region and a logic region; forming a stack structure on the memory region and a gate structure on the logic region; forming a first cap layer on the stack structure and the gate structure; performing an oxidation process to form an oxide layer on the first cap layer; forming a second cap layer on the oxide layer; and removing part of the second cap layer, part of the oxide layer, and part of the first cap layer on the logic region to form a spacer adjacent to the gate structure.

According to another aspect of the present invention, a semiconductor device includes: a substrate having a memory region and a logic region, a gate structure on the logic region, and a first spacer around the gate structure. Preferably, the first spacer further includes a first cap layer, an oxide layer on the first cap layer, and a second cap layer on the oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
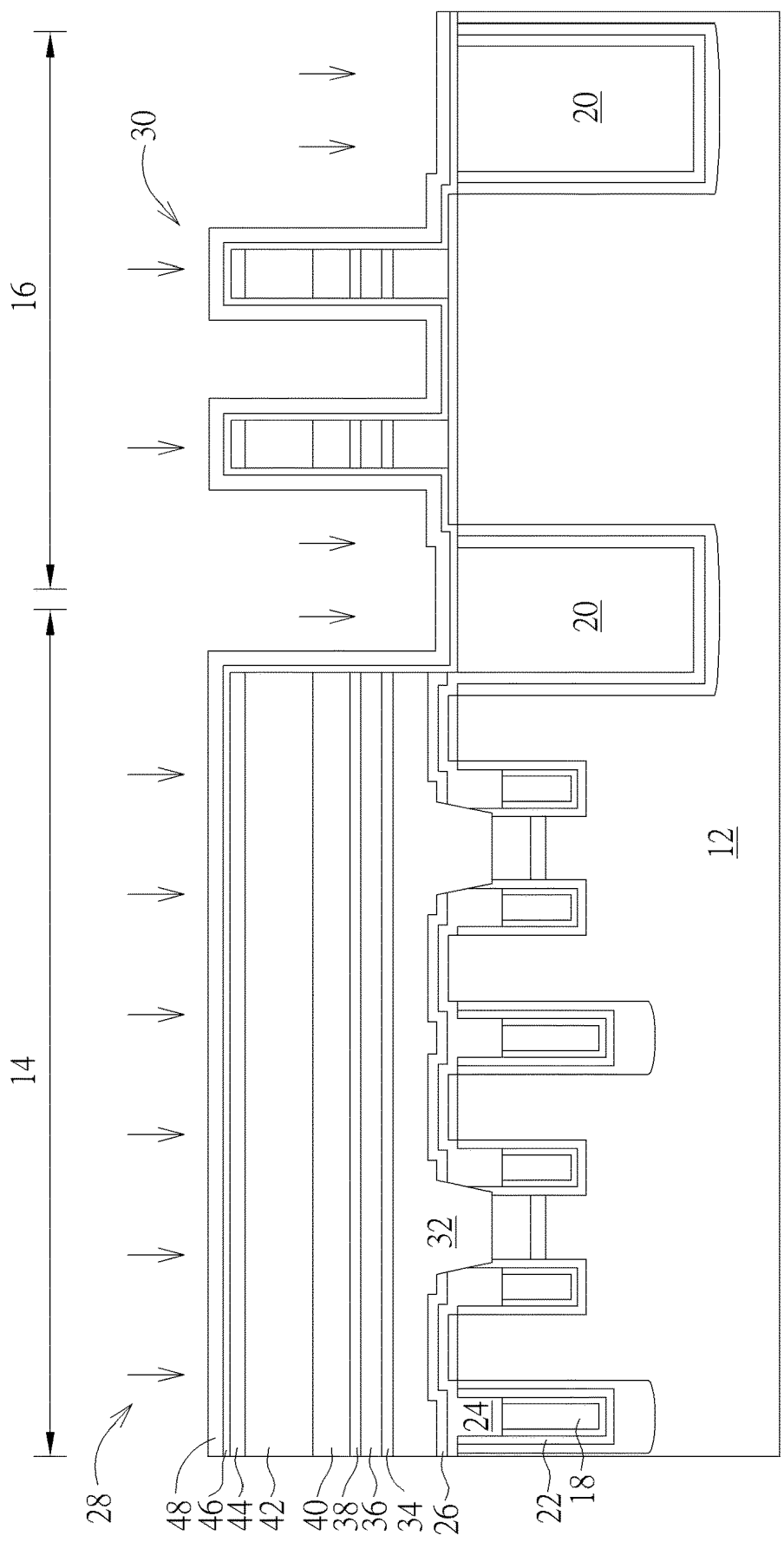
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate 12 such as a silicon substrate or silicon-on-insulator (SOI) substrate is provided. At least a memory region 14 (or cell region) and a logic region 16 (or periphery region) are defined on the substrate 12, in which the memory region 14 is defined to fabricate DRAM device having buried gates and the logic region 16 is defined to fabricate active devices such as metal-oxide semiconductor (MOS) transistors.

In this embodiment, a plurality of buried gate structures 18 could be formed in the substrate 12 on the memory region 14, at least a shallow trench isolation (STI) 20 could be formed in the substrate 12 to divide elements between the memory region 14 and the logic region 16, and each of the STI 20 and an insulating material formed on the substrate 12 on the memory region 14 could include a silicon oxide layer 22, a silicon nitride layer 24, and another silicon oxide layer 26.

Next, a stack structure 28 is formed on the memory region 14 and at least a gate structure 30 is formed on the logic region 16, in which the stack structure 28 is disposed on the substrate 12 on memory region 14 and covering a plurality of buried gate structures 18 within the substrate 12 while the gate structures 30 on the logic region 16 is disposed on the surface of the substrate 12. In this embodiment, the formation of the stack structure 28 and the gate structures 30 could be accomplished by sequentially forming a plurality of material layers (not shown) on the substrate 12 on both the memory region 14 and logic region 16, in which the material layers could include an amorphous silicon layer 32, a titanium (Ti) layer 34, a titanium nitride (TiN) layer 36, a tungsten silicide (WS) layer 38, a tungsten (W) layer 40, a silicon nitride layer 42, and a silicon oxide layer 44. Next, a pattern transfer or photo-etching process is conducted by using a patterned resist (not shown) as mask to remove part of the above material layers to form a stack structure 28 and gate structures 30 on the memory region 14 and logic region 16 respectively.

Next, a first cap layer 46 is formed on the stack structure 28, the gate structures 30, and the STI 20 and an oxidation process is conducted to oxidize part of the first cap layer 46 for forming an oxide layer 48 on the first cap layer 46. In this embodiment, the first cap layer 46 preferably includes silicon carbon nitride (SiCN) and the oxide layer 48 fabricated through the aforementioned oxidation process preferably includes silicon carbon oxynitride (SiCON).

Figure 2:
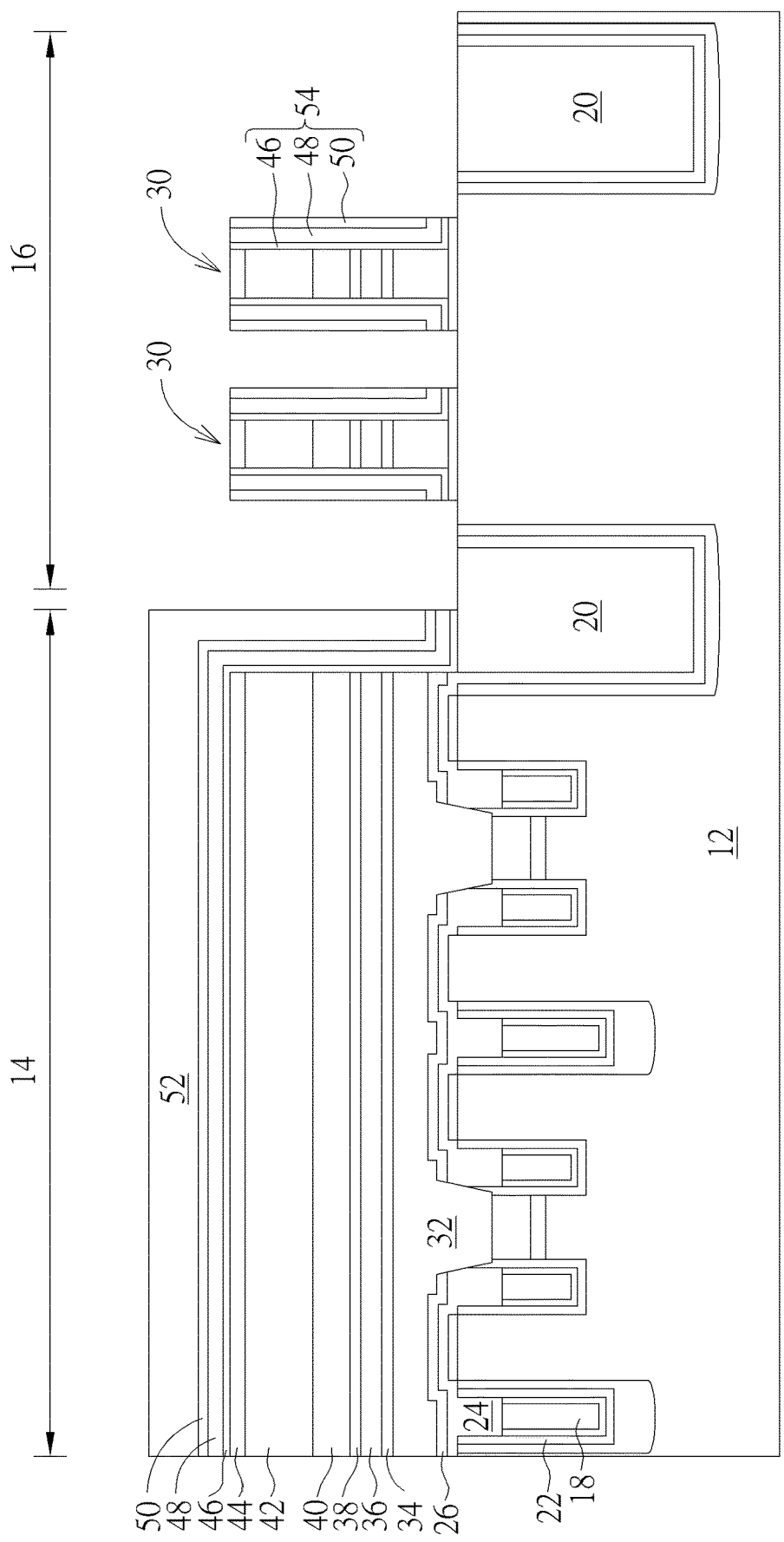

Next, as shown in FIG. 2, a second cap layer 50 is formed on the oxide layer 48, a patterned mask such as patterned resist 52 is formed on the memory region 14, and an etching process is conducted by using the patterned resist 52 as mask to remove part of the second cap layer 50, part of the oxide layer 48, and part of the first cap layer 46 on the logic region 16 to forma first spacers 54 on sidewalls of the gate structures 30. In this embodiment, each of the first spacers 54 preferably includes a first cap layer 46 having L-shaped cross-section, an oxide layer 48 having L-shaped cross-section, and a second cap layer 50 having I-shaped cross-section, in which the second cap layer 50 preferably includes silicon nitride, but not limited thereto.

Next, at least an ion implantation process is conducted by using the patterned resist 52 on the memory region 14 and the gate structures 30 and first spacer 54 on the logic region 16 as mask to implant ions into the substrate 12 adjacent to two sides of the first spacer 54 for forming a doped region (not shown) serving as lightly doped drain (LDD) or source/drain region, in which the lightly doped drain could include n-type or p-type dopants depending on the type of transistor being fabricated.

Figure 3:
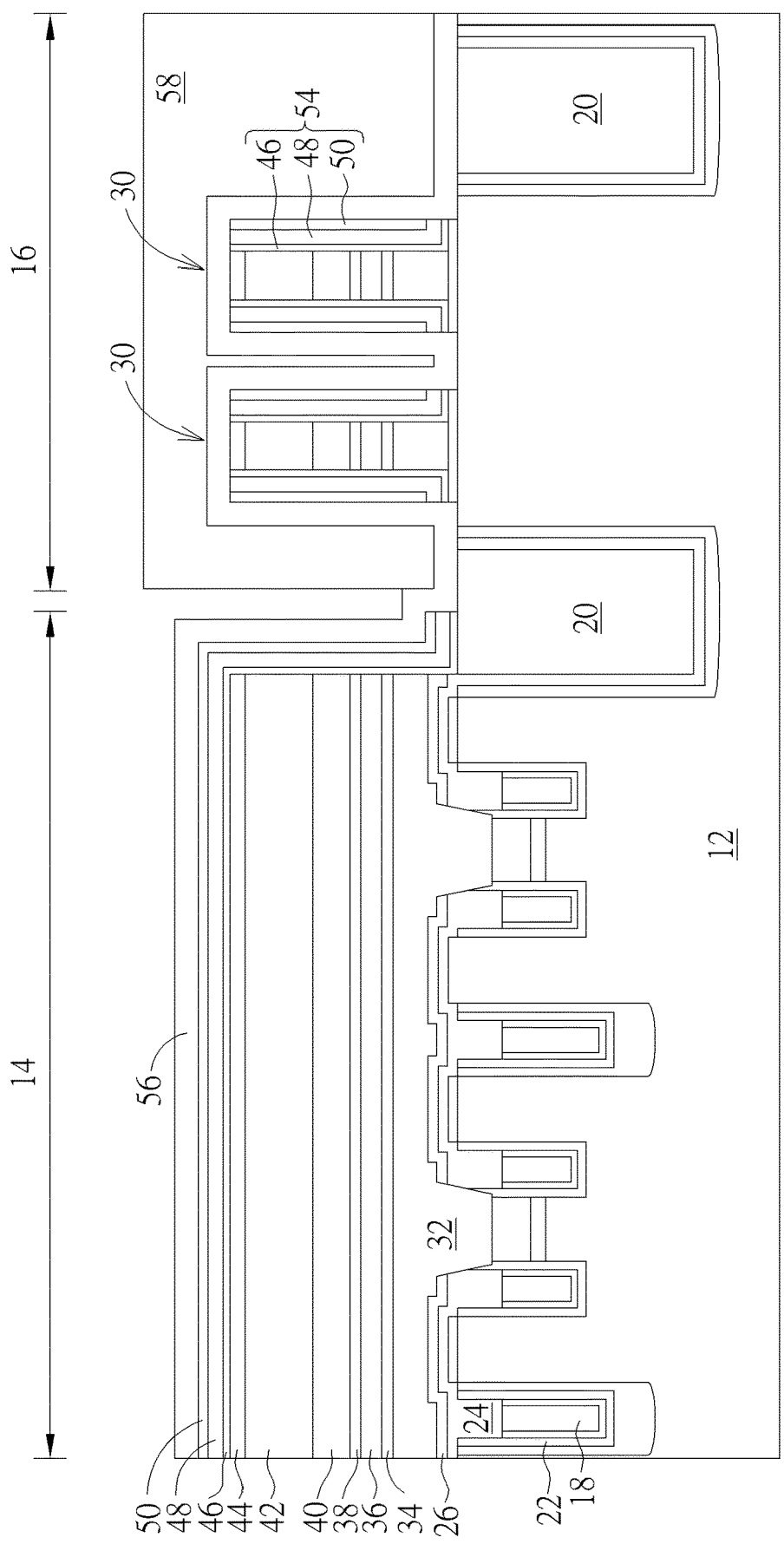

Next, as shown in FIG. 3, after stripping the patterned resist 52 on the memory region 14, a third cap layer 56 is formed on the stack structure 28 and the gate structures 30, in which the third cap layer 56 preferably includes silicon oxide, but not limited thereto. Specifically, the third cap layer 56 preferably covers the exposed surface of the second cap layer 50 on the memory region 14 and the surface of the gate structures 30 and first spacer 54 on the logic region 16. Next, another patterned mask such as patterned resist 58 is formed on the third cap layer 56 the logic region 16 to expose the third cap layer 56 on the memory region 14.

Figure 4:
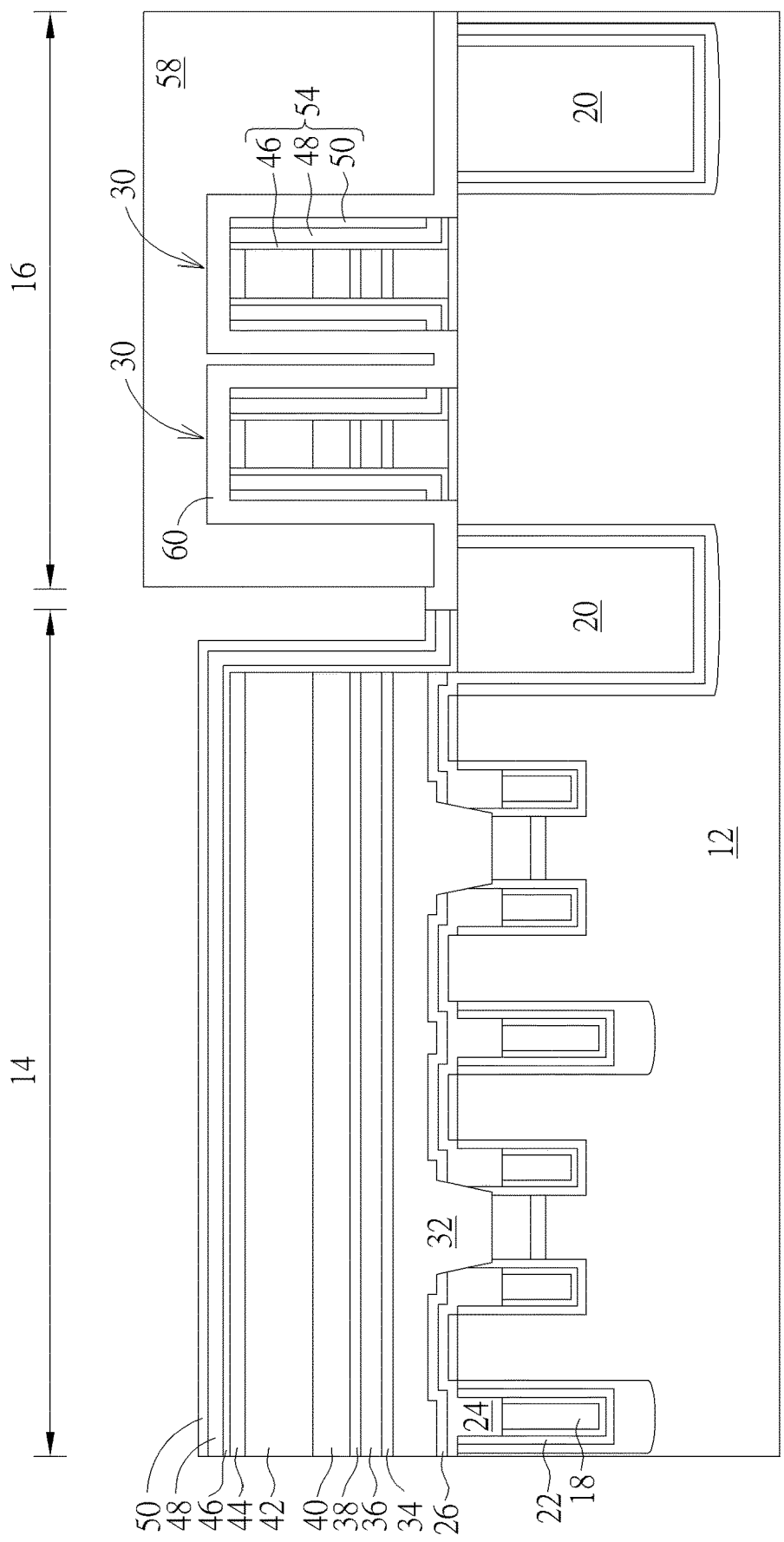

Next, as shown in FIG. 4, an etching process is conducted by using the patterned resist 58 as mask and using a first etchant comprising diluted hydrofluoric acid (dHF) to remove the third cap layer 56 on the memory region 14 and expose the surface of the second cap layer 50 underneath. The remaining third cap layer 56 on the logic region 16 then becomes a second spacer 60 and the second spacer 60 covers the top surface of the gate structures 30 and sidewalls of the first spacer 54.

Figure 5:
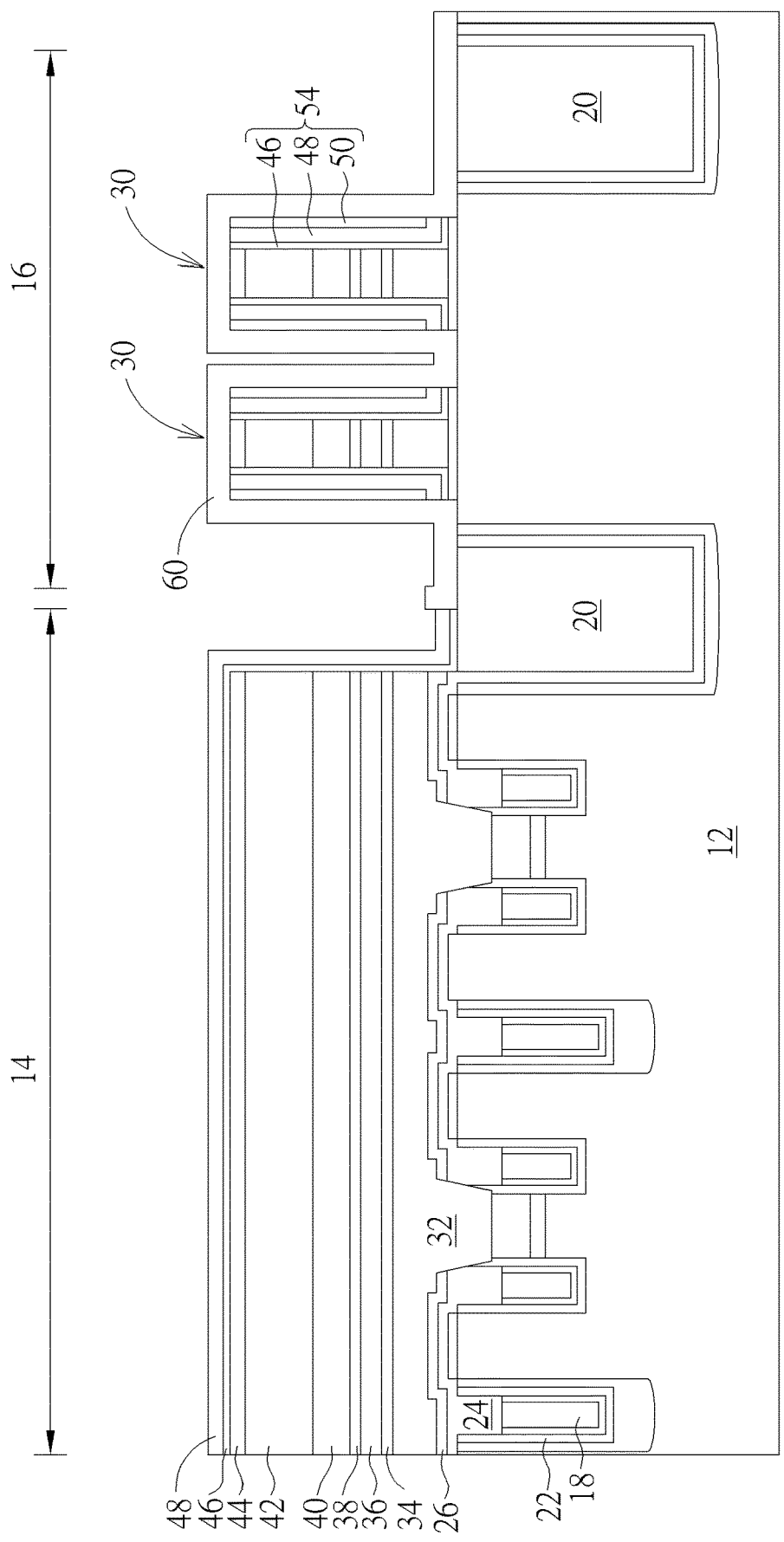

Next, as shown in FIG. 5, another etching process is conducted by using the patterned resist 58 as mask and using a second etchant comprising phosphoric acid to remove the second cap layer 50 on the memory region 14, and the patterned resist 58 is stripped thereafter. It should be noted that since the second cap layer 50 made of silicon nitride is disposed directly on top of the first cap layer 46 made of SiCN in conventional approach with no oxide layer 48 formed between the two cap layer 46 and 50, the surface of the first cap layer 46 made of SiCN underneath is easily damaged by the etchant primarily consisting of phosphoric acid during the removal of the second cap layer 50 made of silicon nitride on the memory region 14. By conducting the aforementioned oxidation process to first form an oxide layer 48 made of SiCON serving as a stop layer on the surface of the first cap layer 46, the present invention is able to stop the etching process using phosphoric acid as etchant right on the oxide layer 48 as soon as the second cap layer 50 on the memory region 14 is removed so that none of the first cap layer 46 underneath would be damaged.

Next, a photo-etching process could be conducted to pattern the stack structure 28 on the memory region 14 to form one or more bit line structures and contact structures such as storage node contacts could be formed adjacent to two sides of the bit line structures on the memory region 14 to electrically connect source/drain region and capacitors formed in the later process and contact plugs could be formed adjacent to two sides of the gate structures 30 on the logic region 16. This completes the fabrication of a semiconductor device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a memory region and a logic region;
    buried gates in the substrate on the memory region, wherein a top surface of the buried gates is lower than a top surface of the substrate;
    a stacked structure on the buried gates on the memory region and the substrate between the buried gates, wherein the stacked structure comprises:
        a first semiconductor layer;
        a first metal layer on the first semiconductor layer; and
        a first dielectric layer on the first metal layer;
    a gate structure on the logic region, wherein the gate structure comprises:
        a second semiconductor layer;
        a second metal layer on the second semiconductor layer; and
        a second dielectric layer on the second metal layer;
    a first spacer around the gate structure, wherein the first spacer comprises:
        a first cap layer on the stacked structure and the gate structure;
        an oxide layer on the first cap layer; and
        a second cap layer on the oxide layer.

2. The semiconductor device of claim 1, wherein the first cap layer is L-shaped.

3. The semiconductor device of claim 1, wherein the oxide layer is L-shaped.

4. The semiconductor device of claim 1, wherein the second cap layer is I-shaped.

5. The semiconductor device of claim 1, wherein the first cap layer comprises silicon carbon nitride.

6. The semiconductor device of claim 1, wherein the oxide layer comprises silicon carbon oxynitride (SiCON).

7. The semiconductor device of claim 1, wherein the second cap layer comprises silicon nitride.

8. The semiconductor device of claim 1, further comprising a second spacer adjacent to the first spacer and on the gate structure.

9. The semiconductor device of claim 8, wherein the second spacer comprises silicon oxide.

* * * * *